United States Patent
Berge et al.

(10) Patent No.: US 9,674,062 B1
(45) Date of Patent: Jun. 6, 2017

(54) MEMORY ARRAY TO GENERATE A DATA EYE DIAGRAM

(71) Applicant: International Business Machines Corporation, Armonk, NY (US)

(72) Inventors: Layne A. Berge, Rochester, MN (US); Benjamin A. Fox, Rochester, MN (US); Wesley D. Martin, Elgin, MN (US); George R. Zettles, IV, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/973,269

(22) Filed: Dec. 17, 2015

(51) Int. Cl.
*H04B 10/07* (2013.01)
*H04L 12/26* (2006.01)
*G11C 29/50* (2006.01)

(52) U.S. Cl.
CPC .......... *H04L 43/0852* (2013.01); *G11C 29/50* (2013.01)

(58) Field of Classification Search
CPC .............. G11C 29/50; G11C 29/50004; G11C 29/5002; G11C 29/5004; H04L 12/26; H04L 12/2634; H04L 12/2697; H04B 3/46; H04B 10/07; H04B 17/00; H04B 17/15; H04B 17/16; H04B 17/19; H04B 17/29
USPC ................................ 375/228, 350, 346, 224
See application file for complete search history.

(56) References Cited

U.S. PATENT DOCUMENTS

| | | | | |
|---|---|---|---|---|
| 6,901,339 B2 * | 5/2005 | Eskeldson | .......... | G01R 31/3016 331/1 A |
| 7,606,297 B2 * | 10/2009 | Waschura | ................. | H04L 1/24 370/333 |
| 7,640,463 B2 | 12/2009 | Windler et al. | | |
| 7,684,478 B2 * | 3/2010 | Cranford, Jr. | .... | G01R 31/31711 375/226 |
| 8,081,723 B1 | 12/2011 | Ding et al. | | |
| 8,111,784 B1 * | 2/2012 | Ding | ..................... | H04L 25/063 327/141 |
| 2004/0268190 A1 | 12/2004 | Kossel et al. | | |

(Continued)

FOREIGN PATENT DOCUMENTS

WO     2012037517 A2     3/2012

OTHER PUBLICATIONS

Al-Taee, et al., "New 2-D Eye-Opening Monitor for Gb/s Serial Links", IEEE Transactions on Very Large Scale Integration (VLSI) Systems, vol. 22, No. 6, Jun. 2014, pp. 1209-1218.

(Continued)

*Primary Examiner* — Siu Lee
(74) *Attorney, Agent, or Firm* — Patterson + Sheridan, LLP

(57) ABSTRACT

An apparatus includes a memory array to generate a data eye diagram. The memory array includes a plurality of rows of memory cells. The memory cells include a first row corresponding to a first sampling circuit of a first plurality of sampling circuits. The first sampling circuit is configured to compare an input voltage signal to a first reference voltage. The memory cells also include a second row corresponding to a second sampling circuit of the first plurality of sampling circuits. The second sampling circuit is configured to compare the input voltage signal to a second reference voltage. Each memory cell of the memory array is an incremental multi-bit counter.

14 Claims, 7 Drawing Sheets

(56) References Cited

U.S. PATENT DOCUMENTS

| | | | |
|---|---|---|---|
| 2008/0013633 A1* | 1/2008 | Ye | H04N 19/13 |
| | | | 375/240.24 |
| 2008/0187033 A1* | 8/2008 | Smith | H04B 17/23 |
| | | | 375/228 |
| 2010/0097087 A1 | 4/2010 | Hogeboom et al. | |
| 2013/0015837 A1 | 1/2013 | Jenkins et al. | |
| 2014/0089612 A1* | 3/2014 | Feldhofer | H03K 21/403 |
| | | | 711/156 |
| 2014/0362901 A1 | 12/2014 | Tan | |
| 2015/0146768 A1 | 5/2015 | Bulzacchelli et al. | |
| 2015/0207480 A1 | 7/2015 | Hoang et al. | |

OTHER PUBLICATIONS

AND9075/D "Understanding Data Eye Diagram Methodology for Analyzing High Speed Digital Signals", on Semiconductor, Semiconductor Components Industries, LLC, Jun. 2015, 7 pp.

Shin, et al., "Design and Experimental Verification of On-Chip Signal Integrity Analyzer (OSIA) Scheme for Eye Diagram Monitoring of a High-Speed Serial Link", 2011 IEEE International Symposium on Electromagnetic Compatibility (EMC), Aug. 14-19, 2011, pp. 119-125.

Wong, et al., "Edge and Data Adaptive Equalization of Serial-Link Transceivers", IEEE Journal of Solid-State Circuits, vol. 43, No. 9, Sep. 2008, pp. 2157-2169.

\* cited by examiner

MEMORY ARRAY TO GENERATE A DATA EYE DIAGRAM

I. FIELD OF THE DISCLOSURE

The present disclosure relates generally to a memory array to generate a data eye diagram.

II. BACKGROUND

High speed serial links (i.e., HSSLs or high speed serial interconnects) are utilized in many embedded system designs, ranging from consumer and mobile devices to routers and switches that power the wired Internet backbone. The range of designs for which a developer may desire reliable and high quality signal integrity over interconnections range, for example, from various automobile rear-view camera systems, where the data rate may be less than 1 Gb/sec (gigabit(s) per second), to high-bandwidth Internet optical routers, where data rates may be 10 Gb/sec or greater.

As HSSLs approach higher speeds (e.g., 12 Gb/sec (SAS (Serial Attached SCSI (Small Computer System Interface) 4)) and 16 Gb/sec (PCI-E (Peripheral Component Interconnect Express) 4.0)), measuring signal quality has become increasingly difficult. With more sophisticated methods of equalization and emphasis, an increasing amount of signal loss may now be compensated for and an error free channel may be maintained. While these methods may lead to higher data rates using existing printed circuit board manufacturing technologies, externally measuring signal quality (e.g., with the aid of an oscilloscope) has specifically become more difficult.

To analyze and represent signal quality a high speed digital signal, a data eye (or data eye diagram) may be generated. The data eye enables key parameters of the electrical quality of the signal to be quickly visualized and determined. The data eye may be constructed from a digital waveform by "folding" the parts of a voltage signal waveform corresponding to each individual bit into a single graph with signal amplitude on one axis and time on another axis. By repeating this construction over many samples (e.g., clock cycles) of the waveform, the resultant graph or diagram represents the average statistics of the signal and resembles an eye. Because a received waveform may be degraded during transmission due to inter-symbol interference, jitter, crosstalk, noise and the like, system performance may be derived by analyzing the data eye corresponding to the received data eye. An "open" data eye may correspond to minimal signal distortion, while a "closed" data eye may imply distortion.

Voltage signals measured external to an electrical package may appear to have a closed eye and may undergo post-processing to determine the voltage signal that a receiver circuit may actually be obtaining. With post-processing in an oscilloscope, a voltage signal may externally appear of satisfactory quality, but may be deficient when received, for example because of the additional loss of the electrical package and the effects of the oscilloscope probing the voltage signal. Further, oscilloscopes may provide a segment of the voltage signal, rather than the complete voltage signal. Moreover, because some HSSLs may have interfaces with a large number of connector lanes, it may be an arduous task to utilize an oscilloscope to determine a data eye.

III. SUMMARY OF THE DISCLOSURE

According to a particular embodiment, an apparatus includes a memory array to generate a data eye diagram. The memory array includes a plurality of rows of memory cells. The memory cells include a first row corresponding to a first sampling circuit of a first plurality of sampling circuits. The first sampling circuit is configured to compare an input voltage signal to a first reference voltage. The memory cells also include a second row corresponding to a second sampling circuit of the first plurality of sampling circuits. The second sampling circuit is configured to compare the input voltage signal to a second reference voltage. Each memory cell of the memory array is an incremental multi-bit counter.

According to another embodiment, a data eye diagram diagnostic circuit includes a first sampling circuit of a first plurality of sampling circuits configured to generate a first output value at a first memory cell of a memory array. The first output value is based on a comparison of a first reference voltage to an input voltage signal. The data eye diagram diagnostic circuit further includes a second sampling circuit of the first plurality of sampling circuits configured to generate a second output value at a second memory cell of the memory array. The second output value is based on a comparison of a second reference voltage to the input voltage signal. The memory array further generates a data eye diagram.

According to another embodiment, a method to generate a data eye diagram of a voltage waveform includes applying an input voltage signal to a first sampling circuit and second sampling circuit of a first plurality of sampling circuits. The method also includes applying a clock signal to the first sampling circuit and the second sampling circuit of the first plurality of sampling circuits. The method includes generating, by the first sampling circuit, a first output value at a first memory cell of a memory array, the first output value based on a comparison of a first reference voltage to the input voltage signal. The method also includes generating, by the second sampling circuit, a second output value at a second memory cell of the memory array, the second output value based on a comparison of a second reference voltage to the input voltage signal. The memory array corresponds to the data eye diagram.

One advantage of the present disclosure is improved efficiency and accuracy in generating and storing an on-chip data eye diagram in real-time. For example, the systems and methods of the present disclosure may enable generation of a data eye diagram using a memory array rather than an external device, such as an oscilloscope. Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

V. DETAILED DESCRIPTION

Example embodiments may include a memory array and sampling circuitry to store and record a received data eye diagram on an integrated circuit (i.e., chip) over a time clock period (e.g., one or more clock cycles) without using a large amount of chip area for memory or analog circuitry. Accordingly, high speed interface design and testing, such as those used in, for example, data centers running cloud applications or the processing of mobile or social data, may be performed with greater accuracy and efficiency.

Located after a de-emphasis (e.g., equalizer or conditioning) sub-circuit, the memory array and the sampling circuitry may dynamically measure a received waveform in real-time. The memory array and sampling the circuitry may easily and efficiently "collect" a data eye diagram and "see" all bits passing through the circuitry once turned "on," and not just an occasional (or segment of a) voltage waveform. Thus, the example embodiments may be "continuously looking" at the voltage waveform, providing a more complete data eye diagram. Further, exemplary embodiments include a plurality of sampling circuits to record and store a received data eye diagram in a one time-step interval (e.g., one time interval). Moreover, depending on developer requirements, a particular granularity (i.e., a level of detail) may be chosen to improve a measured eye resolution and the chip area consumed. A further advantage of the example embodiments includes the capacity of the data eye generation circuitry to be disabled on an integrated circuit chip without impacting the functionality of the other parts of the integrated circuit chip.

Figure 1:
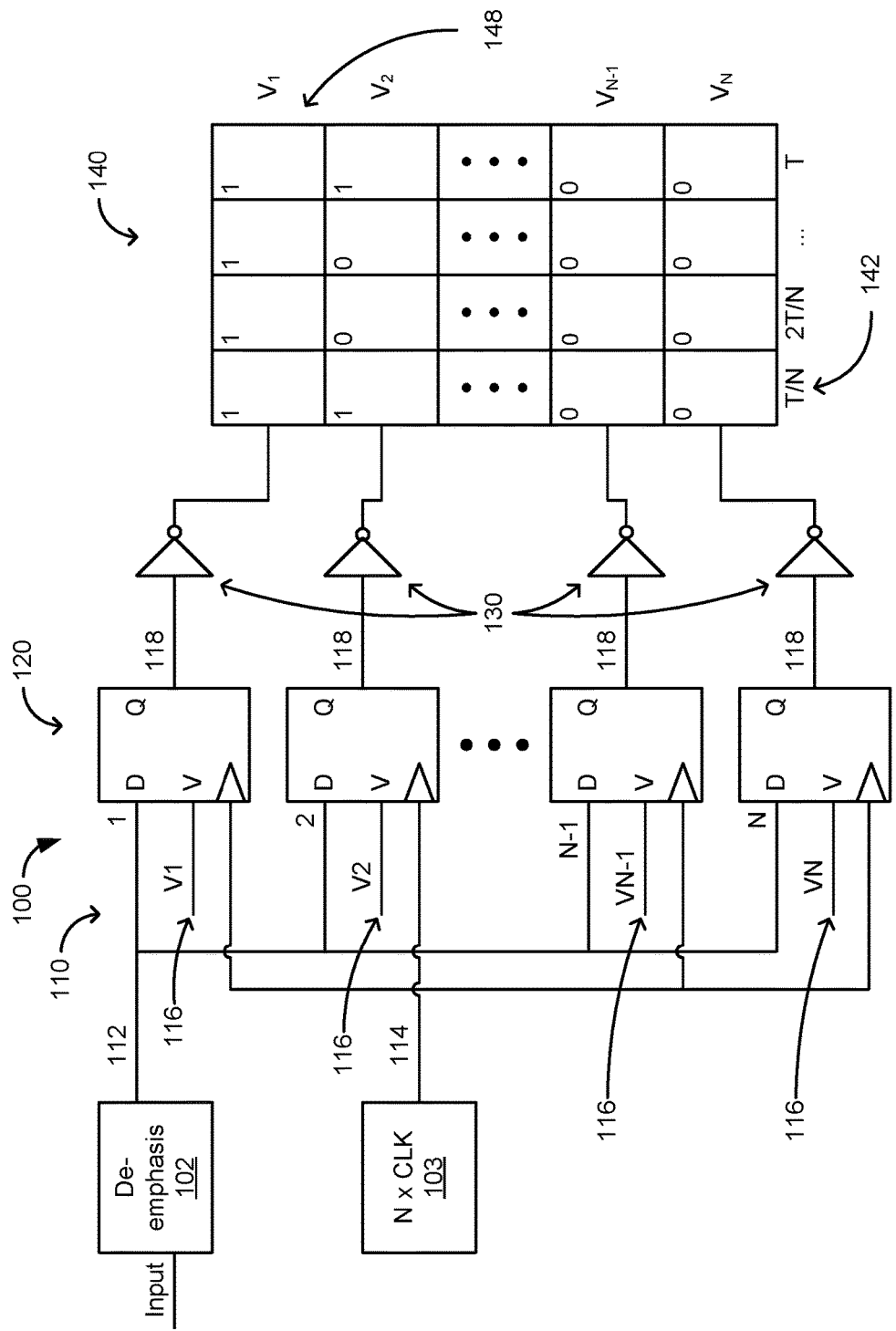
FIG. 1 is a block diagram illustrating a system that may be used to generate a data eye diagram, according to one embodiment.

FIG. 1 is a block diagram illustrating a system that may be used to generate a data eye diagram, according to one embodiment. FIG. 1 illustrates simplified components of a sub-circuit that may be used in an integrated circuit area efficient design system 100 (i.e., ICAED 100). The ICAED 100 may include data eye diagram circuitry 110 and a memory array 140, and may be positioned on a voltage path downstream from a de-emphasis (e.g., equalizer or conditioning) sub-circuit 102. The data eye diagram circuitry 110 may include a plurality of sampling circuits 120 (denoted in FIG. 1 as sampling circuit 1, sampling circuit 2 . . . sampling circuit N−1, and sampling circuit N). N may any integer greater than or equal to 2 and may be chosen based on design constraints, available chip area, etc.

In embodiments, the sampling circuits 120 may be capture latches, each having a reference voltage input V and an output Q value corresponding to a logical "1" or "0" when the particular capture latch is sampled (e.g., strobed). In a particular embodiment, each of the outputs Q 118 of the plurality of sampling circuits 120 may be provided to a respective inverter 130 before being stored and recorded in a memory array 140. The memory array 140 may include a plurality of memory cells, where each memory cell may be an incremental multi-bit counter (i.e., an x-bit counter, where x is an integer greater than one). The memory array 140 may include a plurality of rows, where each row corresponds to a particular sampling circuit and an associated reference voltage (denoted in FIG. 1 as $V_1, V_2, \ldots V_{N-1}, V_N$) received by the particular sampling circuit. In FIG. 1, a row 148 is shown as a representative row of memory array 140. The memory array 140 may also include a plurality of columns, where each column corresponds to an interval of a clock cycle, as further described herein.

In an example operation, a voltage signal 112 (i.e., an input voltage waveform), which may be a filtered digital output from the de-emphasis sub-circuit 102, may be provided to a first sampling circuit (e.g., sampling circuit 1) of the plurality of sampling circuits 120. Further, a clock signal 114 may also be provided to the first sampling circuit (e.g., sampling circuit 1). Presuming an N-level of granularity (i.e., an N-level of detail of a measured eye resolution), the clock signal 114 may be a second clock signal that is generated by multiplying a first clock signal by N (e.g., via an illustrative multiplier 103), and voltage signal 112 may be sampled at N multiplied by the rate of the first clock signal (i.e., N×CLK). In examples, the rate of the first clock signal may be 1 Gb/sec and N×CLK may be at least 2 Gb/sec. In a particular embodiment, each of the N sampling circuits 120 may sample the voltage signal 112 at different reference voltages (i.e., threshold voltage levels) of a plurality of reference voltages 116 (denoted in FIG. 1 as reference voltage V1, reference voltage V2 . . . reference voltage VN−1, reference voltage VN).

The N sampling circuits 120 may incorporate features of both a flip-flop and a comparator. As an example, in sampling circuit 1 at a first interval of a clock cycle, the voltage signal 112 may be compared to reference voltage V1. For instance, an example input voltage signal may be 2 volts (V) and the reference voltage V1 may be set at 1V. As the input voltage signal 112 is greater than the reference voltage V1, the sampling circuit 1 may output a logical "0" value for a first time interval of the clock cycle (e.g., at a time T/N). The example output 118 may be sent to a respective inverter 130, and the output of the inverter 130 may be stored in the corresponding cell of the memory array 140. In the memory array 140, in response to the output of the inverter 130, the appropriate memory cell of the memory array 140 would increment by one count value (e.g., one integer). As this particular output of the inverter 130 corresponds to sampling circuit 1 (and reference V1) and the first time interval (T/N) of the clock cycle, the upper left most corner memory cell of the memory array 140 would increment by one count value.

In an alternative example, in sampling circuit 1, the voltage signal 112 is 0.5V and the reference voltage V1 is set at 1V. When sampled at a first time interval of the clock cycle (e.g., at a time T/N), the output of the inverter 130 for the first sampling circuit would be a logical "1" because the input voltage signal 112 is less than the reference voltage V1. In this case, the upper left most corner memory cell of the memory array would not be incremented. In alternative examples, the output 118 may be directly provided to the memory array 140. In such instances, the inverters 130 would not be utilized.

In an example, the time intervals (e.g., T/N to T) may be of equivalent length and the reference voltages (e.g., V1 to VN) may be of equivalent voltage levels. In an alternative example, one or both of the time intervals or the reference voltages may vary.

In this manner, the data eye diagram circuitry 110 may generate output values for each of the plurality of sampling circuits 120 to populate and increment cells of the memory array 140. For example, during a first clock cycle (of duration T), at time T/N, each memory cell in the first column (e.g., column 142) of the memory array 140 may be incremented or remain at a (initial) zero value, based on the generated output values received from the inverters 130. Next, at time 2T/N, each memory cell in the second column of the memory array 140 may be incremented or remain at a zero value based on the generated output values. During the first clock cycle, this process may be repeated N times, where each repetition results in selectively incrementing the cells of a different column of the memory array. Accordingly, at the end of the first clock cycle (at time T) each memory cell of the memory array 140 may either store a "0" or a "1" value. During a next (e.g., second) clock cycle, the process may be repeated such that the data eye diagram circuitry 110 may again generate output values for each of the plurality of sampling circuits 120. At the end of the second clock cycle, each memory cell of the memory array 140 may store a "0", "1", or "2" value. This procedure may continue for a particular number of cycles or until a particular event occurs (e.g., until a counter corresponding to one or more of the cells of the memory array 140 reaches a particular value, such as a maximum counter value).

Accordingly, in the data eye diagram circuitry 110, N sampling circuits 120 may be clocked at N times a clock rate to populate the memory array 140. By incrementing the memory cells in the memory array 140, the number of times an input voltage waveform is above or below particular reference voltage over a particular time duration (of one or more clock cycles) may be collected (i.e., stored) and measured. As further described herein, the counter values stored in each memory cell of the memory array 140 may be correspond to a constructed data eye diagram for the input voltage signal 112.

Figure 2:
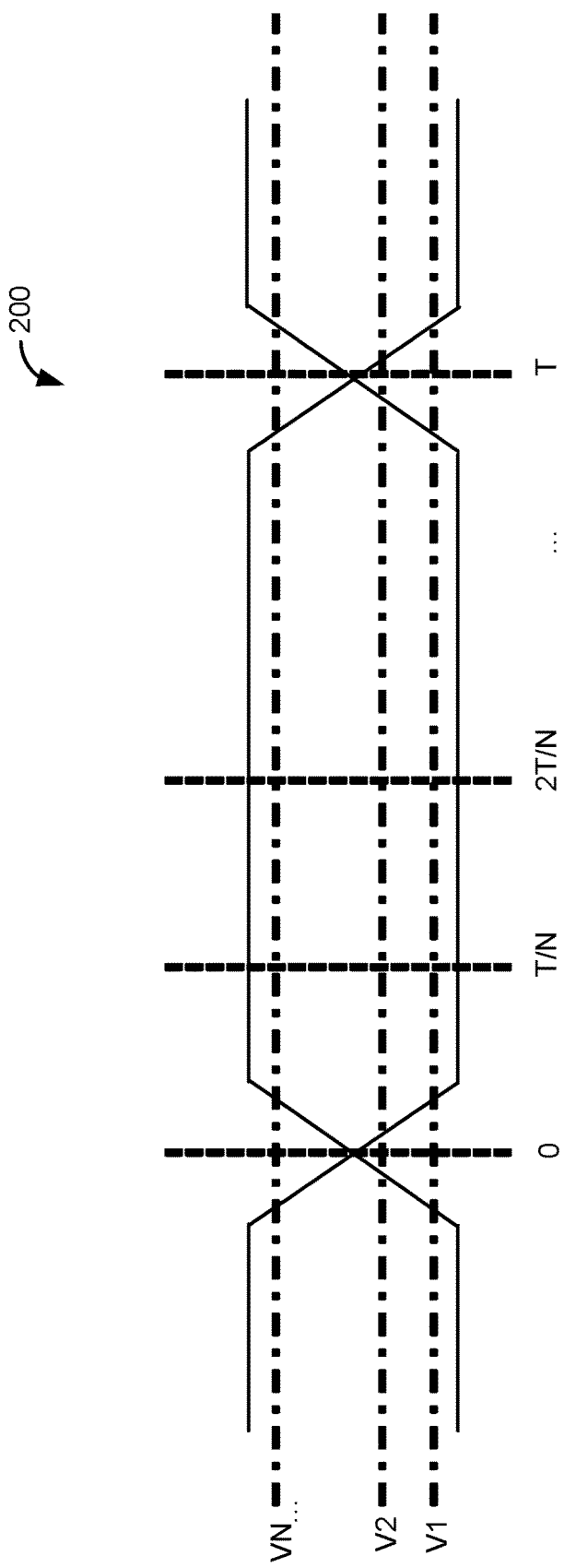
FIG. 2 is a particular illustrative diagram of an example voltage waveform according to an embodiment.

Referring to FIG. 2, a particular illustrative diagram of a voltage waveform according to an embodiment is disclosed and generally designated 200. FIG. 2 depicts how an example voltage waveform, such as the input voltage signal 112, may be sampled. In FIG. 2, the vertical (Y)-axis may represent the reference voltages (e.g., V1 to VN) and the horizontal (X)-axis may represent the time intervals of an example clock cycle (e.g., 0 to T) as the parameters for each clock cycle of the waveform (i.e., a clock time period). For example, the rising edge and falling edge of the clock cycle may correspond to time "0" and time "T".

Figure 3:
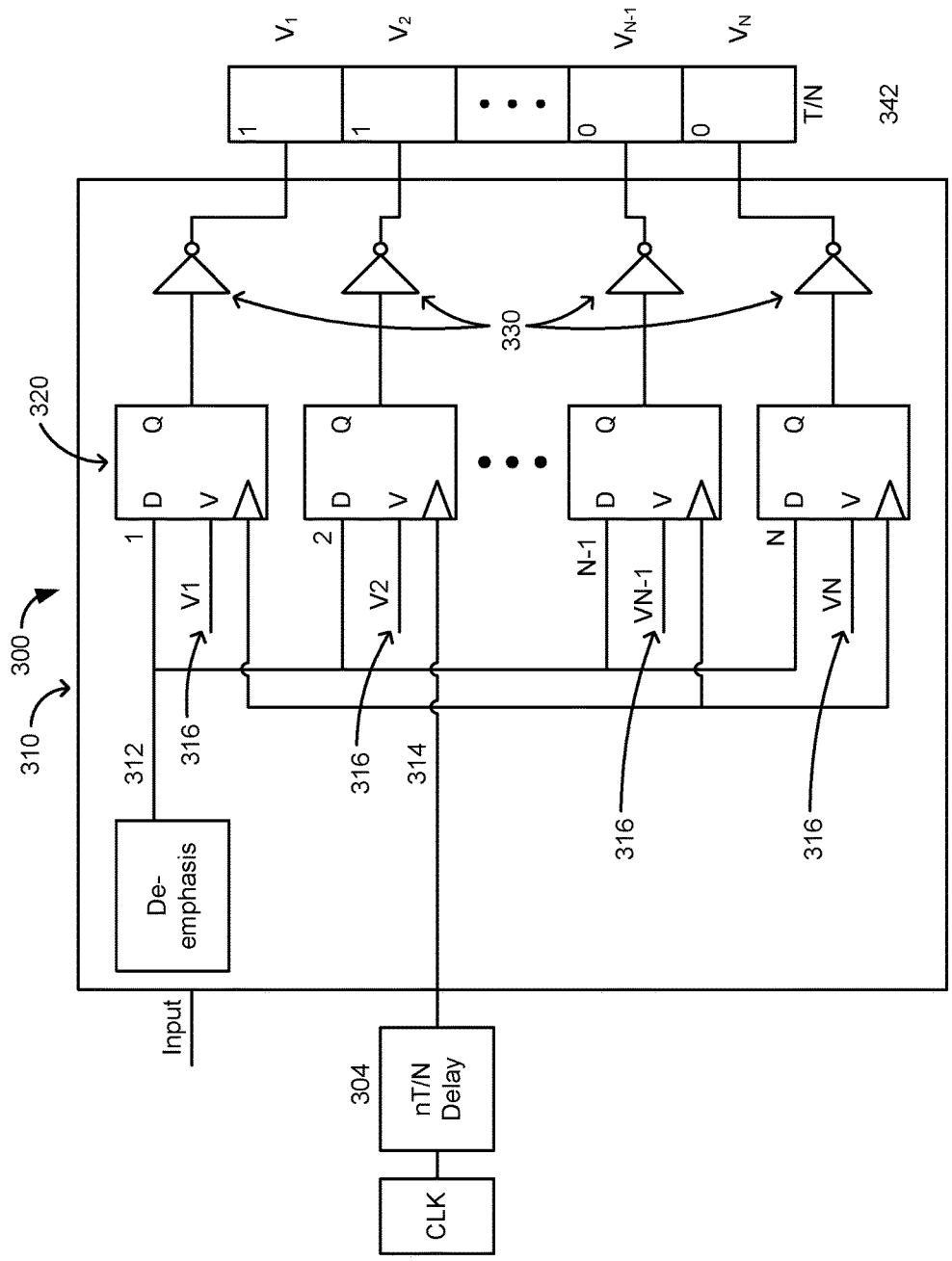
FIG. 3 is a block diagram illustrating a portion of a system that may be used to generate a data eye diagram, according to one embodiment.
Figure 4:
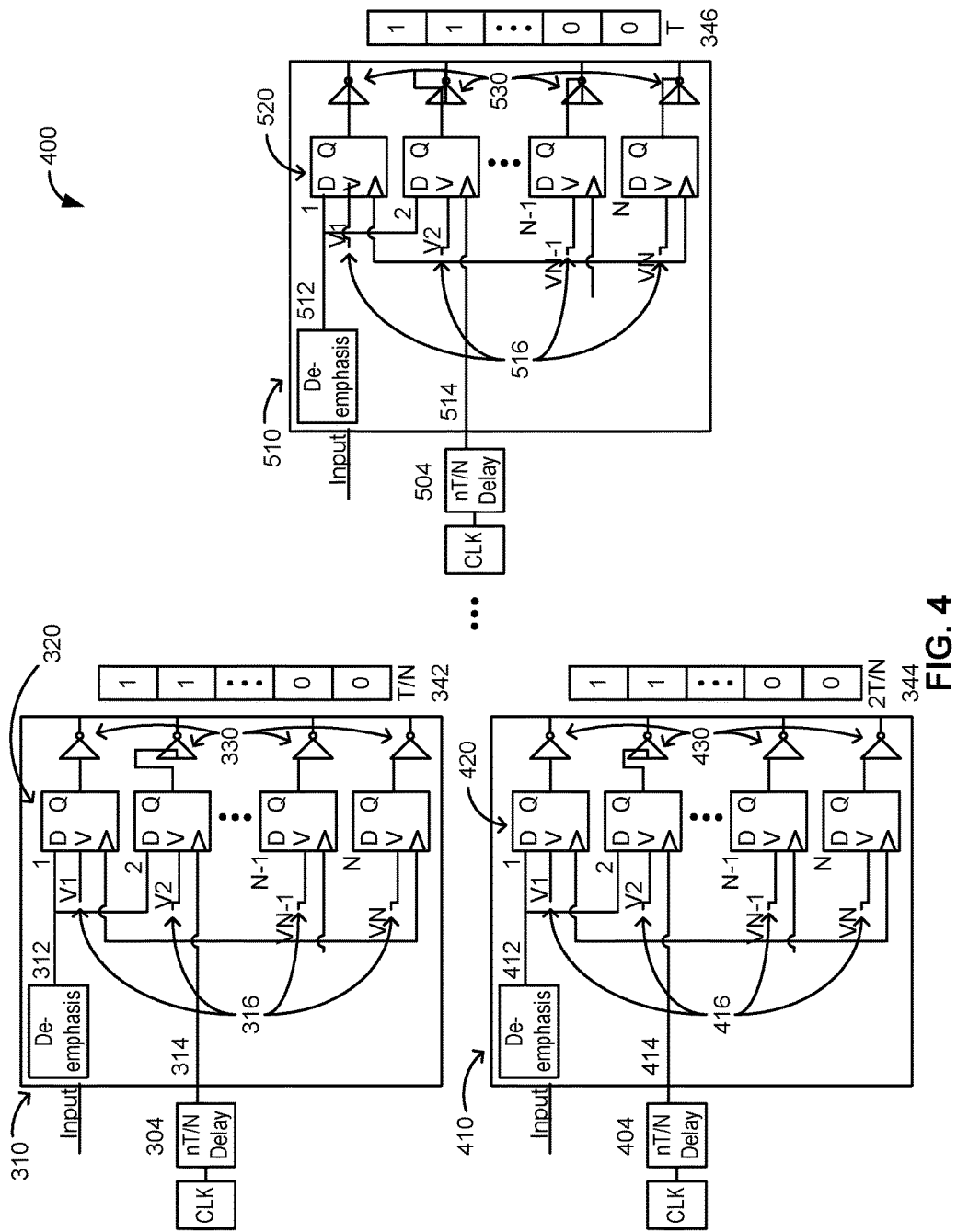
FIG. 4 is a block diagram illustrating a system that may be used to generate a data eye diagram, according to one embodiment.

FIGS. 1-2 thus illustrate the sampling of a voltage signal according to integrated chip area efficient design, in which an input clock signal can be multiplied (e.g., by the multiplier 103) based on a desired sampling granularity (e.g., the value of N in FIG. 1). In certain instances, a multiplied clock (e.g., N×CLK) may be difficult to implement due to already high clock speeds. Accordingly, utilizing multiple capture latch chains in parallel (i.e., a plurality of sampling circuits), where each of the capture latch chains may be delayed by a different amount to attain a desired time granularity, may provide a solution that is easier to implement in systems with high clock speeds. FIGS. 3-4 are diagrams illustrating a system that may be used to generate a data eye diagram in such as a high clock speed system, according to one embodiment. In particular, FIG. 3 illustrates simplified components of a sub-circuit that may be used in an example building block (300) of a high speed design system (i.e., a HSD 400 as described with reference to FIG. 4). The example building block 300 may include a clock delay block (i.e., nT/N delay) 304 and data eye diagram circuitry 310 corresponding to one time interval (e.g., T/N) one column 342 of a memory array. The example building block 300 may also include additional components operating as described with reference to corresponding components of FIG. 1, such as sampling circuits, inverters, and a de-emphasis sub-circuit.

In embodiments, the clock delay block 304 may delay the clock by a fractional amount (n). In the example of FIG. 3, n=1. As shown in FIG. 4, several building blocks similar to the building block 300 of FIG. 3 may be included in data eye diagram circuitry according to an embodiment. In such examples, each of the building blocks may delay the clock by a different fractional amount (e.g., n=1, n=2, . . . n=N) and may be used to selectively increment a different column of memory cells (e.g., multi-bit counters). Thus, instead of using a multiple of the clock and "hopping" sampling circuits in each different row, as shown in FIG. 1, in the HSD 400 of FIG. 4, each column of memory cells may be linked to its own set of capture latches (e.g., its own plurality of sampling circuits). In doing so, the HSD 400 may utilize the same clock (or in some instances, a slower clock signal) delayed by a fractional amount (n) of the clock. As further described with reference to FIG. 4, the clock may be replicated in parallel for each of the building blocks.

Thus, as shown in FIG. 4, the HSD 400 may include a plurality of data eye diagram circuitries (e.g., 310, 410, 510), where each data eye diagram circuitry may include a respective plurality of sampling circuits (e.g., 320, 420, 520) and correspond to particular time interval of a clock cycle. Moreover, in embodiments, each of the plurality of sampling circuits may be coupled to a respective clock delay block 304, 404, 504, where each of the clock delay blocks delays an input clock signal by a different amount. As shown in FIG. 4, each of the data eye diagram circuitries (e.g., 310, 410, 510) may be to configured to output values to be stored in and increment a particular column of memory cells (e.g., columns corresponding to T/N, 2T/N, . . . T). By combining the columns of memory cells, a memory array corresponding to the received data eye diagram may be generated.

In an example operation, each of the plurality of data eye diagram circuitries (i.e., each of the building blocks) (e.g., 310, 410, 510) may generate output values for each respective plurality of sampling circuits (e.g., 320, 420, 520) to populate corresponding columns of memory cells (e.g., 342, 344, and 346) of a memory array. For example, during a first clock cycle (of duration T), the data eye diagram circuitries may sequentially increment the columns of the memory array associated with different time intervals (e.g., T/N, 2 T/N, T) based on their respective clock delay blocks (e.g., nT/N delay). In examples, for each of the data diagram circuitries, each of the clock delay blocks delay the clock signal at a different amount. In doing so, for the first clock cycle, the columns of the memory array may be incremented or remain at an (initial) zero value based on the generated output values received from the inverters (e.g., 330, 430, 530). Accordingly, at the end of the first clock cycle (at time T) each memory cell of the columns of the memory array may either store a "0" or a "1" value. During a next (e.g., second) clock cycle, the process may be repeated such that each of the data eye diagram circuitries 310, 410, 510 may again generate output values for each of the plurality of sampling circuits 320, 420, 520. At the end of the second clock cycle, each memory cell of the columns of the memory array may store a "0", "1", or "2" value. This procedure may continue for a particular number of cycles or until a particular event occurs (e.g., until a counter corresponding to one or more of the cells of the memory array 140 reaches a particular value, such as a maximum counter value). After combining the columns of the memory array, the received data eye diagram may be generated. In other embodiments, for example, the columns of the memory array may be incremented or remain at an (initial) zero value based on the generated output values received from each of the plurality of sampling circuits.

In an example, the time intervals (e.g., T/N to T) of each of the plurality of data eye diagram circuitries (e.g., 310,

410, 510) may be of equivalent length and the reference voltages (e.g., V1 to VN) may be of equivalent voltage levels. In an alternative example, one or both of the time intervals or the reference voltages may vary.

Figure 5:
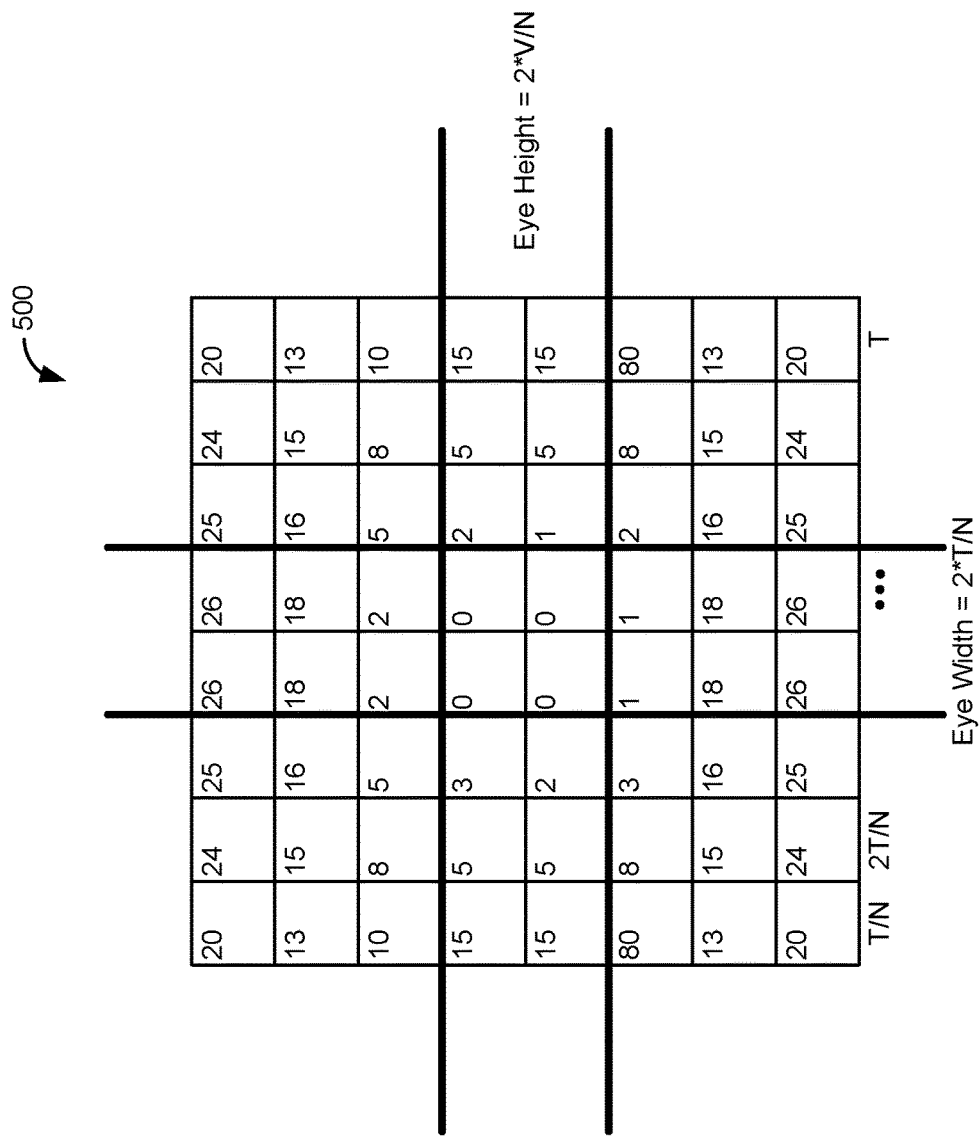
FIG. 5 is an graphical representation of example data eye diagram, according to one embodiment.

FIG. 5 is a graphical representation of example data eye diagram, according to one embodiment. For example, in FIG. 5, a memory array 500 as populated by either the ICAED 100 (as shown in FIG. 1) or the HSD 400 (as shown in FIG. 4) is shown. In embodiments, while the ICAED 100 or HSD 400 may be implemented differently, the resultant values stored in the memory array 500 may be the same. Over a time clock period, the memory array 500 may keep track of "hits" to determine the data eye diagram. In FIG. 5, the eye height and width may be determined by looking at the number of "non-hit" cells in the memory array, where a "non-hit" cell is a cell that includes minimal or no data values. In the illustrated embodiment, the eye height may be equal to 2×V/N and the eye width may be equal to 2×T/N. In FIG. 5, the center "non-hit" memory cells result in an "open" data eye diagram. Alternatively, if there were "hits" in the center memory cells, a closed data eye diagram would be represented. An open data eye diagram may correspond to minimal signal distortion, while a closed data eye may imply distortion. By dynamically populating such a memory array, continuous sampling in real-time (or near real-time) may be realized. Thus, the quality of a serial link may be measured of over a significant amount of time without consuming a significant amount of memory internally. Further, bit error ratios (BERs) may also be extracted depending upon the amount of time a data eye diagram has been enabled as well as the height and width of a generated eye.

Figure 6:
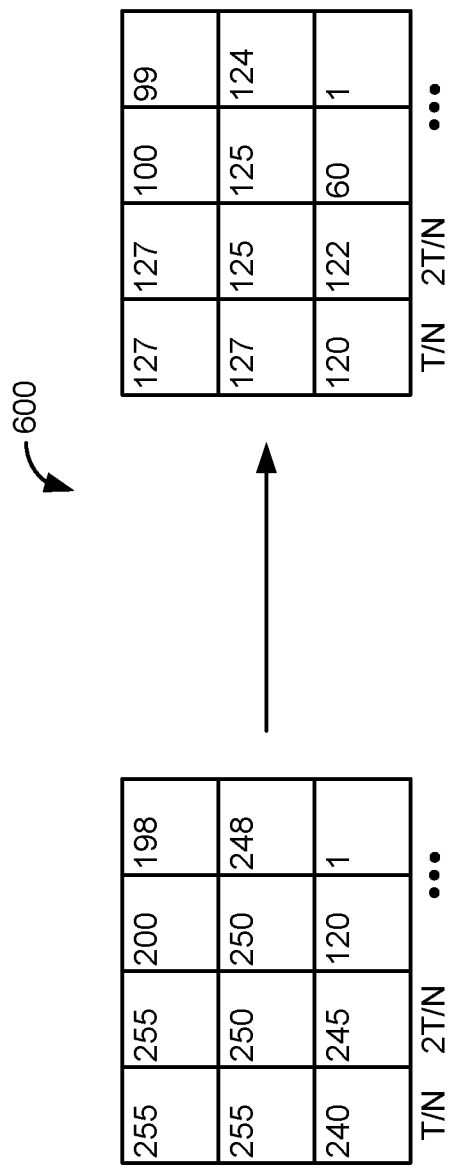
FIG. 6 is a representation of an example normalization procedure, according to one embodiment.

FIG. 6 is a representation of an example normalization procedure that may be implemented by both the ICAED 100 and the HSD 400, according to one embodiment. To prevent data loss due to overflow of the counter memory cells, a normalization algorithm (i.e., a normalization procedure) may be implemented to keep the relative amount of "hits" in each memory similar. Such normalization may be performed during operation of the ICAED 100 and HSD 400. For instance, as shown in FIG. 6 at 600, if an example memory cell is an 8-bit counter, once the particular memory cell reaches 255, instead of overflowing, a logic circuit may halve the counter amounts in each cell of the memory array.

In embodiments, for instance, example memory cells may be 8-bit or 16-bit counter. A normalization procedure may be implemented when a counter reaches $2^{x-1}$ (where x is the number of bits stored in the memory cells, such as x=8 or x=16). In one instance, the normalization procedure may include dividing the value stored in every memory cell by 2. This procedure may be performed on the memory array by a bit shift by one operation. A memory cells that stores a 1 value may continue to store the 1 value in order to record the single hit by the waveform. In another normalization procedure, the memory array may simply stop recording hits in array elements once the counter threshold $2^{x-1}$ is reached. It should be noted that in alternative embodiments, a mathematical operation other than dividing by two may be used. Performing normalization as shown in FIG. 6 may provide an extension of time so that a data eye diagram can be generated by collecting data for a larger time period.

Figure 7:
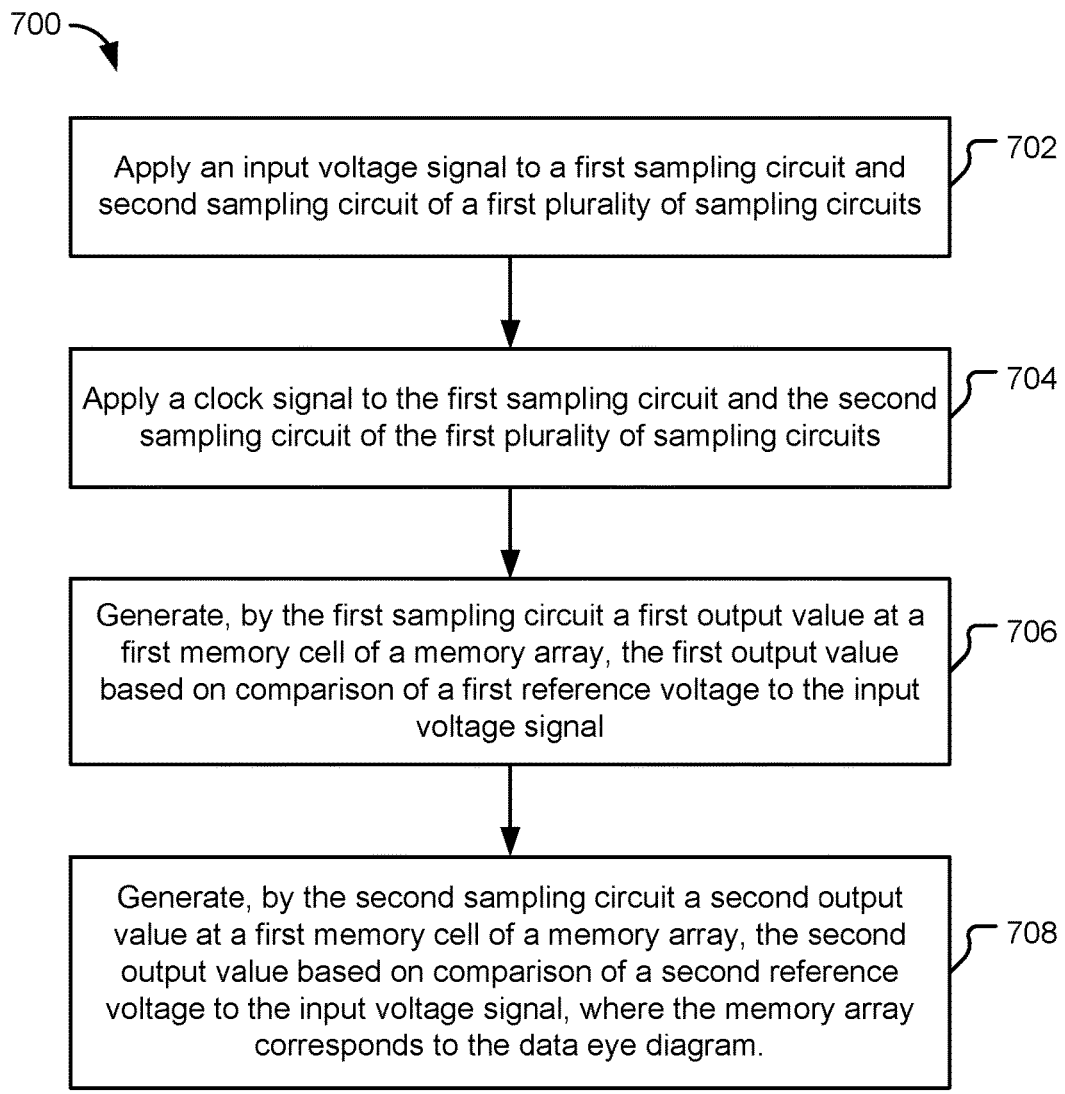
FIG. 7 is a flowchart of a method of generating a data eye diagram, according one embodiment.

FIG. 7 is a flowchart of a method of generating a data eye diagram, according one embodiment. In an illustrative implementation, the method 700 is performed by the ICAED 100 of FIG. 1 and HSD of FIG. 4.

The method 700 includes applying an input voltage signal to a first sampling circuit and second sampling circuit of a first plurality of sampling circuits, at 702. For example, as described with reference to FIGS. 1, 3, and 4, the data eye diagram circuitry (e.g., 110, 310, 410, 510) may apply an input voltage signal (e.g., 112, 312, 412, 512) to a first sampling circuit and second sampling circuit of a first plurality of sampling circuits (e.g., 120, 320, 420, 520).

The method 700 includes applying a clock signal to the first sampling circuit and the second sampling circuit of the first plurality of sampling circuits, at 704. For example, as described with reference to FIGS. 1, 3, and 4, the data eye diagram circuitry (e.g., 110, 310, 410, 510) may apply a clock signal (e.g., 114, 314, 414, 514) to the first sampling circuit and the second sampling circuit of the first plurality of sampling circuits (e.g., 120, 320, 420, 520).

The method 700 includes generating, by the first sampling circuit, a first output value at a first memory cell of a memory array, the first output value based on a comparison of a first reference voltage to the input voltage signal, at 706. For example, as described with reference to FIGS. 1, 3, and 4, the first sampling circuit may generate a first output value at a first memory cell of a memory array (e.g., 140, 500), the first output value based on comparison of a first reference voltage (e.g., 116, 316, 416, 516) to the input voltage signal (e.g., 112, 312, 412, 512).

The method includes generating, by the second sampling circuit, a second output value at a first memory cell of a memory array, the second output value based on a comparison of a second reference voltage to the input voltage signal, where the memory array corresponds to the data eye diagram, at 708. For example, as described with reference to FIGS. 1, 3, and 4, the second sampling circuit may generate a second output value at a second memory cell of a memory array (e.g., 140, 500), the second output value based on comparison of a second reference voltage (e.g., 116, 316, 416, 516) to the input voltage signal (e.g., 112, 312, 412, 512).

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

Integrated circuits or chips that may be designed and/or fabricated in accordance with the described techniques can be distributed by a fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to explain the principles of the embodiments, the practical application or technical improvement over technologies found in the marketplace, or to enable others of ordinary skill in the art to understand the embodiments disclosed herein.

Those skilled in the art can make numerous uses and modifications of and departures from the apparatus and techniques disclosed herein without departing from the described concepts. For example, components or features illustrated or described in the present disclosure are not limited to the illustrated or described locations, settings, or contexts. Examples of apparatuses in accordance with the present disclosure can include all, fewer, or different components than those described with reference to one or more of the preceding figures. The present disclosure is therefore not to be limited to specific implementations described herein, but rather is to be accorded the broadest scope possible consistent with the appended claims, and equivalents thereof.

The invention claimed is:

1. An apparatus comprising:
a memory array configured to generate a data eye diagram, the memory array comprising:
a plurality of rows of memory cells comprising:
a first row corresponding to a first sampling circuit of a first plurality of sampling circuits, the first sampling circuit configured to compare an input voltage signal to a first reference voltage; and
a second row corresponding to a second sampling circuit of the first plurality of sampling circuits, the second sampling circuit configured to compare the input voltage signal to a second reference voltage, wherein each memory cell of the memory array is an incremental multi-bit counter; and
a plurality of columns of memory cells comprising:
a first column corresponding to a first time interval; and
a second column corresponding to a second time interval;
wherein the first plurality of sampling circuits corresponds to the first time interval, and wherein a second plurality of sampling circuits corresponds to the second time interval.

2. The apparatus of claim 1, wherein the data eye diagram is generated over a time period.

3. The apparatus of claim 1, wherein the data eye diagram is generated without an oscilloscope.

4. The apparatus of claim 1, wherein the memory array dynamically stores values corresponding to a received waveform in real-time or near real-time.

5. The apparatus of claim 1, wherein the incremental multi-bit counter is configured based on a normalization procedure.

6. The apparatus of claim 1, wherein the first plurality of sampling circuits is coupled to a first clock delay block and the second plurality of sampling circuits is coupled to a second clock delay block, and wherein the first clock delay block delays an input clock signal by a different amount than the second clock delay block delays the input clock signal.

7. A data eye diagram diagnostic circuit comprising:
a first sampling circuit of a first plurality of sampling circuits configured to generate a first output value at a first memory cell of a memory array, the first output value based on a comparison of a first reference voltage to an input voltage signal; and
a second sampling circuit of the first plurality of sampling circuits configured to generate a second output value at a second memory cell of the memory array, the second output value based on a comparison of a second reference voltage to the input voltage signal,
wherein the memory array comprises a plurality of columns, and wherein a first column of the plurality of columns corresponds to a first time interval and a second column of the plurality of columns corresponds to a second time interval, and wherein the first plurality of sampling circuits corresponds to the first time interval and a second plurality of sampling circuits corresponds to the second time interval, and wherein the memory array is configured to generate a data eye diagram.

8. The data eye diagram diagnostic circuit of claim 7, wherein the first memory cell and the second memory cell of the memory array each comprises an incremental multi-bit counter.

9. The data eye diagram diagnostic circuit of claim 7, wherein the memory array comprises a plurality of rows, wherein a first row of the plurality of rows corresponds to the first reference voltage associated with the first sampling circuit and a second row of the plurality of rows corresponds to the second reference voltage associated with the second sampling circuit.

10. The data eye diagram diagnostic circuit of claim 7, wherein the first sampling circuit generates a plurality of output values, each of the plurality of output values corresponding to a different time interval of a clock cycle.

11. The data eye diagram diagnostic circuit of claim 7, wherein the first sampling circuit generates a first output value at the first memory cell of the memory array at a first time interval, and wherein the second sampling circuit generates a second output value at the second memory cell of the memory array at the first time interval.

12. The data eye diagram diagnostic circuit of claim 7, wherein the first plurality of sampling circuits is coupled to a first clock delay block and the second plurality of sampling circuits is coupled to a second clock delay block, and wherein the first clock delay block delays an input clock signal by a different amount than the second clock delay block delays the input clock signal.

13. A method to generate a data eye diagram of a voltage waveform, the method comprising:
applying an input voltage signal to a first sampling circuit and second sampling circuit of a first plurality of sampling circuits;
applying a clock signal to the first sampling circuit and the second sampling circuit of the first plurality of sampling circuits;
generating, by the first sampling circuit, a first output value at a first memory cell of a memory array, the first output value based on a comparison of a first reference voltage to the input voltage signal; and
generating, by the second sampling circuit, a second output value at a second memory cell of the memory array, the second output value based on a comparison of a second reference voltage to the input voltage signal, wherein the memory array corresponds to the data eye diagram,
wherein the memory array comprises a plurality of rows and a plurality of columns, wherein a first row of the plurality of rows corresponds to the first reference voltage associated with the first sampling circuit and a second row of the plurality of rows corresponds to the second reference voltage associated with the second sampling circuit, and wherein a first column of the plurality of columns corresponds to a first time interval and a second column of the plurality of columns corresponds to a second time interval, and wherein the first plurality of sampling circuits corresponds to the first time interval, and wherein a second plurality of sampling circuits corresponds to the second time interval.

14. The method of claim 13, wherein the first plurality of sampling circuits is coupled to a first clock delay block and the second plurality of sampling circuits is coupled to a second clock delay block, and wherein the first clock delay block delays an input clock signal by a different amount than the second clock delay block delays the input clock signal.

* * * * *